(12) United States Patent
Park et al.

(10) Patent No.: US 7,006,402 B2
(45) Date of Patent: Feb. 28, 2006

(54) MULTI-PORT MEMORY DEVICE

(75) Inventors: Byung-Il Park, Ichon-shi (KR); Beom-Ju Shin, Ichon-shi (KR)

(73) Assignee: Hynix Semiconductor INC, (KR)

( * ) Notice: Subject to any disclaimer, the term of this patent is extended or adjusted under 35 U.S.C. 154(b) by 125 days.

(21) Appl. No.: 10/750,156

(22) Filed: Dec. 31, 2003

(65) Prior Publication Data
US 2005/0047255 A1    Mar. 3, 2005

(30) Foreign Application Priority Data
Aug. 29, 2003  (KR) ..................... 10-2003-0060250
Dec. 17, 2003  (KR) ..................... 10-2003-0092375

(51) Int. Cl.
*G11C 8/00*    (2006.01)
(52) U.S. Cl. ............... 365/230.05; 365/51; 365/63; 365/230.03
(58) Field of Classification Search ............... 365/51, 365/63, 230.03, 230.05
See application file for complete search history.

(56) References Cited

U.S. PATENT DOCUMENTS 5,812,490 A * 9/1998 Tsukude ..................... 365/233
5,867,439 A * 2/1999 Asakura et al. ............. 365/222
6,809,946 B1 * 10/2004 Fujisawa et al. ............. 365/51

FOREIGN PATENT DOCUMENTS

JP        09-161476        6/1997

* cited by examiner

*Primary Examiner*—Tan T. Nguyen
(74) *Attorney, Agent, or Firm*—Blakely, Sokoloff, Taylor & Zafman (57) ABSTRACT

A multi-port memory device includes a plurality of banks arranged at an upper and a lower portion of a core area as many as a fixed number in a row direction, a multiplicity of ports located at edges of the upper and the lower portions of the core area, wherein respective ports perform independent communication with respective different target devices, a first global data bus, located in a row direction between the ports and the banks arranged at the upper portion of the core area, for performing the parallel data transmission, a second global data bus, located in a row direction between the ports and the banks arranged at the lower portion of the core area, for performing the parallel data transmission, many local data buses, arranged in a column direction of each bank, for executing data transmission within the banks, and a majority of local data bus connection units, located between two banks adjacent to each other in a column direction, for selectively connecting the local data buses corresponding to the two adjacent banks.

13 Claims, 12 Drawing Sheets

MULTI-PORT MEMORY DEVICE

FIELD OF THE INVENTION

The present invention relates to a semiconductor memory design technology; and, more particularly, to a multi-port memory device.

BACKGROUND OF THE INVENTION

In general, most of memory devices such as a random access memory (RAM) employ one port at which lots of input/output (I/O) pin sets are located. That is, a memory device has only one port for data exchange with a chipset. However, recently, it is getting ambiguous to classify functions of the chipset and those of the memory device, and the integration of the chipset and the memory device is considered. In view of this tendency, there is required a multi-port memory device capable of directly exchanging data with its peripheral devices such as a graphic device, a CPU and so on. In order to implement the multi-port memory device, any one of many ports should be accessible to all memory cells.

An interface originally means a border, a contact surface or an area shared by two components, i.e., two functional units. In a system or device, the interface means the interconnection between devices having different functions. On the other hand, for the data transmission, it includes physical connection conditions between two systems or devices, mechanical conditions such as a physical surface, an interval of a connection component or a sub-system and so on, electric conditions such as a matching signal level, impedance, a power level, etc., and specifications for a signal format and a circuit type relating to the interconnection between two devices or systems.

Meanwhile, although there are lots of interfaces such as an I/O interface, a man-machine interface, a system-call interface, a communication protocol and so on, the I/O interface will be only considered hereinafter.

The I/O interface is an electrical and mechanical treating method so as to exactly transfer transmitting/receiving information to other parts when performing the communication by connecting different functional units with signal lines. The signal lines are unified and called a bus. There are a data bus, a control bus, a ground bus and so on and the number of signal lines of the bus is varied according to a feature of the interface.

In case of a parallel I/O interface, while the data transmission efficiency (speed) is superior since it is possible to transmit several bit data at the same time through several signal lines, a transmission cost increases as a data transmission distance becomes longer when the number of signal lines is great. Therefore, the parallel I/O interface is used at a short data transmission distance requiring a high speed.

In case of a serial I/O interface, the data transmission is performed through one signal line. Therefore, although its data transmission speed is lower than that of the parallel I/O interface, it has a simpler hardware structure and a control scheme than the parallel I/O interface. However, it is not true that the serial transmission scheme is always slower than the parallel transmission scheme.

In a computer, there are lots of devices whose bit transmission is executed in parallel. The RAM generally used as an auxiliary memory device also employs the parallel I/O interface. Namely, the RAM exchanges data in parallel with external devices through a plurality of I/O pins (DQ).

In the meantime, as described above, an effort to change the conventional parallel I/O interface to the serial I/O interface continues so as to compensate the disadvantages of the parallel I/O interface. The interface in the RAM is also required to be changed to the serial I/O interface with regard to the compatibility with other serial I/O interface devices. Furthermore, in case of the above multi-port memory device, since it has a plurality of ports, and the numbers of pads and pins increases in proportion to the number of ports when it uses the parallel I/O interface, it is inevitable that there follows a difficulty in packaging. Therefore, it is advantageous to adopt the serial I/O interface in the multi-port memory device.

Figure 1:
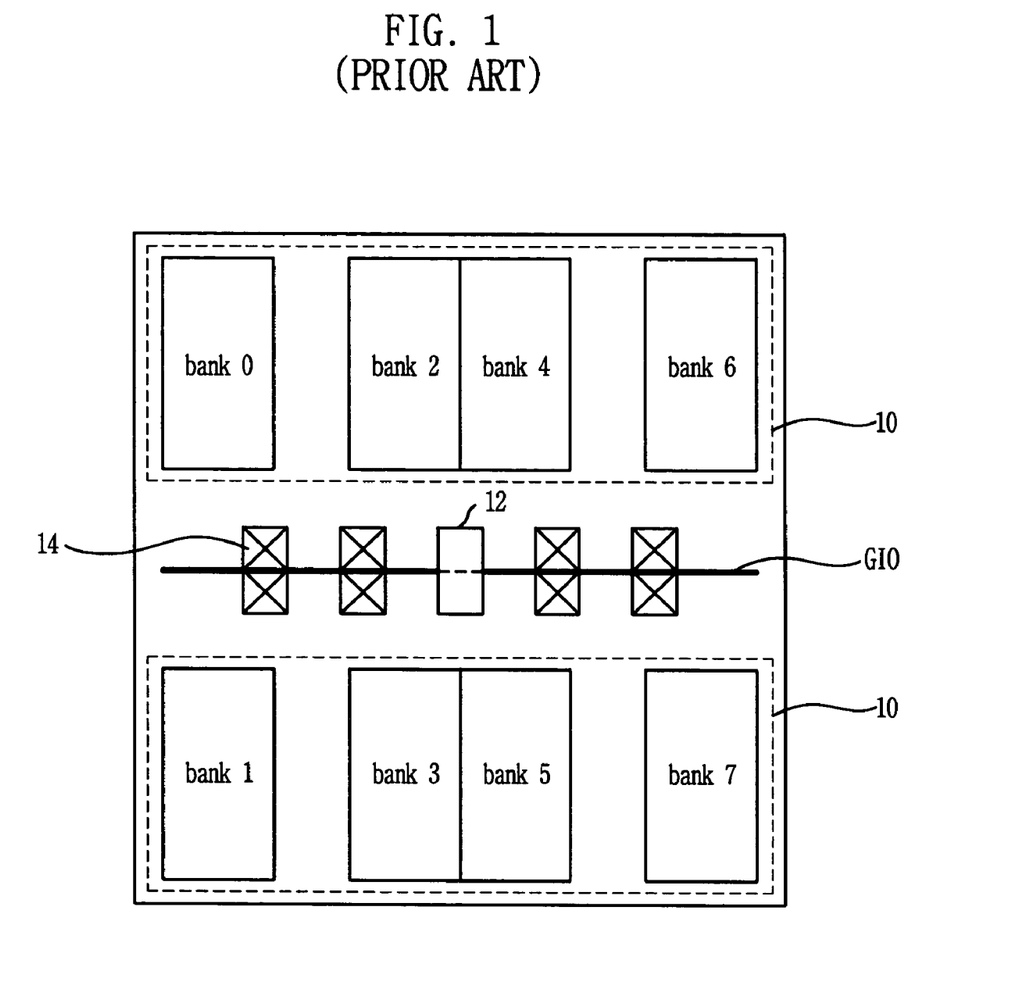
FIG. 1 shows a floor plan of a multi-port memory device having 8 banks according to a conventional DRAM structure.

Referring to FIG. 1, there is shown a floor plan of a multi-port memory device having 8 banks according to a conventional DRAM structure.

In FIG. 1, the multi-port memory device includes a core area 10 divided into an upper and a lower portion, a global data bus GIO and a plurality of ports 14, which are arranged at its central area. A control block 12 is also located at the central area between the upper portion and the lower portion of the core area 10. At each of the upper and the lower portions of the core area 10, there are arranged 4 banks, e.g., bank0, bank2, bank4 and bank6 at the upper portion, and bank1, bank3, bank5 and bank7 at the lower portion in a row direction.

In case of adopting this architecture, since there exists a blank area between banks, wherein the blank area due to wires (not shown) between the upper/lower banks and the global data bus GIO and the plurality of ports, the layout efficiency is deteriorated.

Figure 2:
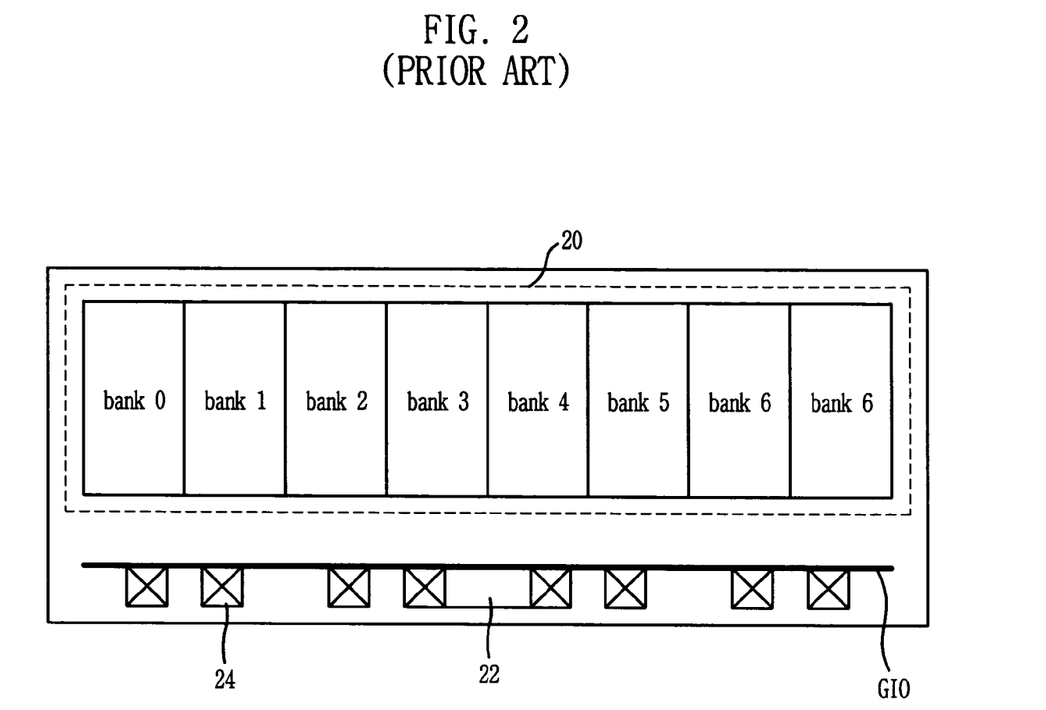
FIG. 2 illustrates a floor plan of a multi-port memory device having ports arranged at one side of a core area.

Referring to FIG. 2, there is illustrated a floor plan of a multi-port memory device having ports arranged at one side of a core area.

In FIG. 2, the multi-port memory device includes 8 banks, bank0 to bank7, arranged in a row direction without dividing a core area 20, one global data bus GIO and a multiplicity of ports 24 arranged at a lower part (or upper part) of the core area 20. A control block 22 is located at a center of the lower part of the core area 20.

While there is an effect that the blank area is reduced when adopting the architecture shown in FIG. 2, a die shape is vertically long and the ports and global data bus GIO lean to one side. As a result, the easiness of packaging and the expandability such as the integration capability and the number of banks are deteriorated.

Figure 3:
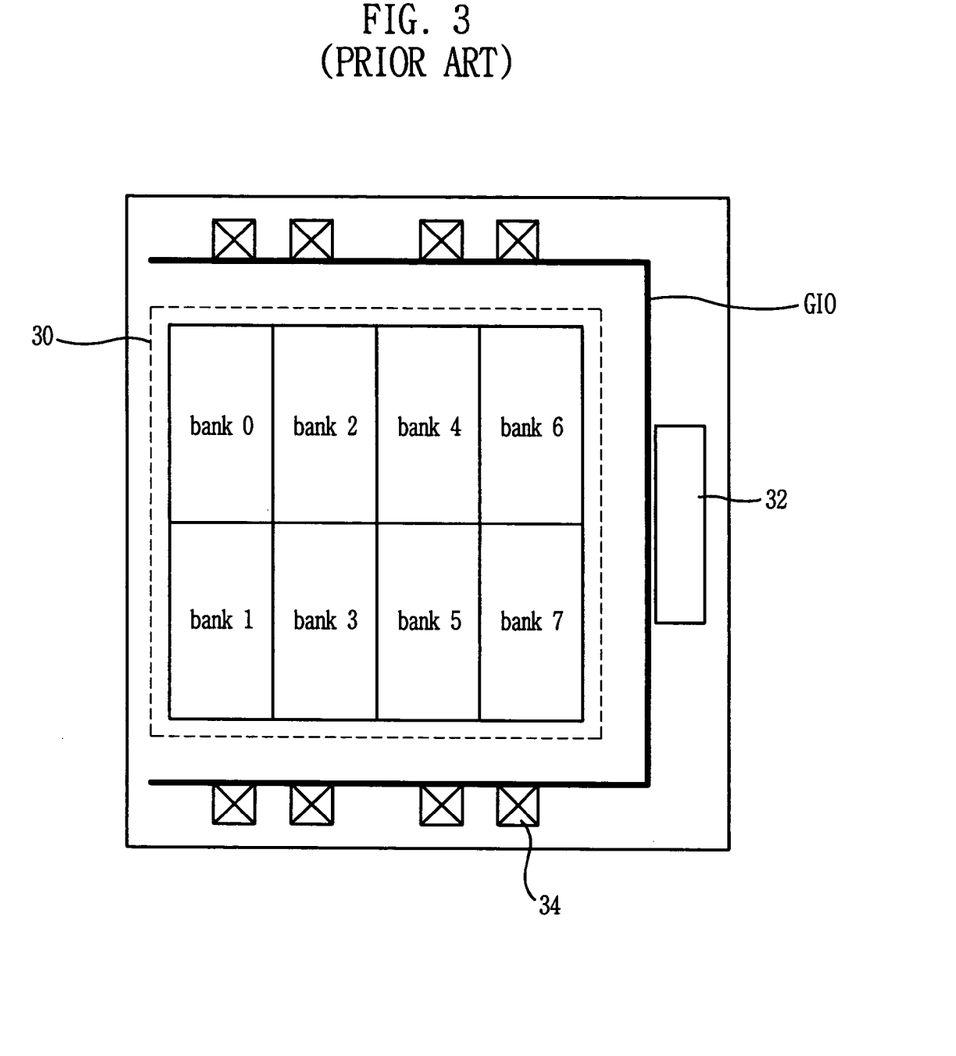
FIG. 3 is a floor plan of a multi-port memory device having ports arranged at both sides of a core area.

FIG. 3 is a floor plan of a multi-port memory device having ports arranged at both sides of a core area.

In FIG. 3, although a core area 30 of the multi-port memory device is not divided, the arrangement of banks, e.g., bank0 to bank7, is similar to that in FIG. 1 and a multiplicity of ports 34 is arranged in an upper and a lower part of the core area 30. A global data bus GIO is located at three sides along with edges of the core area 30 and a control block 32 is located at one side of the core area 30.

In case of adopting this architecture, although it is possible to overcome the problems that the architectures in FIGS. 1 and 2 have, the line length of the global data bus GIO becomes longer, resulting in the increase of the loading of the global data bus GIO seen by the banks, bank0 to bank7, and the ports 34.

The problems described above are getting serious as the number of banks and that of signal lines of the global data bus GIO are greater, the number of signal lines closely relating to a bandwidth.

SUMMARY OF THE INVENTION

It is, therefore, a primary object of the present invention to provide a multi-port memory device capable of reducing the loading of a global data bus as well as securing the layout efficiency, packaging easiness and expandability.

Another object of the present invention is to provide a multi-port memory device capable of supporting a broad bandwidth internally.

In accordance with an embodiment of the present invention, there is provided a multi-port memory device, comprising: a plurality of banks arranged at an upper and a lower portion of a core area as many as a fixed number in a row direction; a multiplicity of ports located at edges of the upper and the lower portions of the core area, wherein respective ports perform independent communication with respective different target devices; a first global data bus, located in a row direction between the ports and the banks arranged at the upper portion of the core area, for performing the parallel data transmission; a second global data bus, located in a row direction between the ports and the banks arranged at the lower portion of the core area, for performing the parallel data transmission; many local data buses, arranged in a column direction of each bank, for executing data transmission within the banks; and a majority of local data bus connection units, located between two banks adjacent to each other in a column direction, for selectively connecting the local data buses corresponding to the two adjacent banks.

In accordance with another embodiment of the present invention, there is provided a multi-port memory device, comprising: a plurality of banks arranged at each of 4 quadrants obtained by dividing a core area in four as many as a fixed number in a row direction, wherein each bank includes a multiplicity of memory cells and a row decoder; a majority of ports located at edges of said each of the 4 quadrants, wherein respective ports perform independent communication with respective different target devices; a first to a fourth global data bus, located in a row direction between the ports and the banks corresponding to said each of the 4 quadrants, for performing the parallel data transmission; a first and a second global data bus connection unit, located between two global data buses adjacent to each other in a row direction, for selectively connecting the two global data buses; a multiplicity of local data buses, arranged in a column direction of each bank, for executing data transmission within the banks; and local data bus connection units, located between two banks adjacent to each other in a column direction, for selectively connecting local data buses corresponding to the two adjacent banks.

In accordance with further another embodiment of the present invention, there is provided a multi-port memory device, comprising: a plurality of banks arranged at each of 4 quadrants obtained by dividing a core area in four as many as a fixed number in a row direction, wherein each bank includes a multiplicity of memory cells and a row decoder; an intermediating unit, located between the first and the third quadrants and the second and the fourth quadrants to divide the core area in two, for intermediating operations of components constructing the memory device by generating internal command signals, internal address signals and control signals based on commands and addresses provided from outside; a majority of ports located at edges of said each of the 4 quadrants, wherein respective ports perform independent communication with respective different target devices; a first to a fourth global data bus, located in a row direction between the ports and the banks corresponding to said each of the 4 quadrants, for performing the parallel data transmission; a first and a second global data bus connection unit, located between two global data buses adjacent to each other in a row direction, for selectively connecting said two global data buses; a multiplicity of local data buses, arranged in a column direction of each bank, for executing data transmission within the banks; many local data bus connection units, located between two banks adjacent to each other in a column direction, for selectively connecting the local data buses corresponding to the two adjacent banks; a plurality of bus connection units, located between each bank and a global data bus corresponding to a quadrant where said each bank is included, for performing data communication between each local data bus and said global data bus; and a number of data transmission units, located between each port and a global data bus corresponding to said each port, for performing data transmitting/receiving between said each port and said global data bus.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, some of the preferred embodiments of the present invention will be explained in detail.

Figure 4:
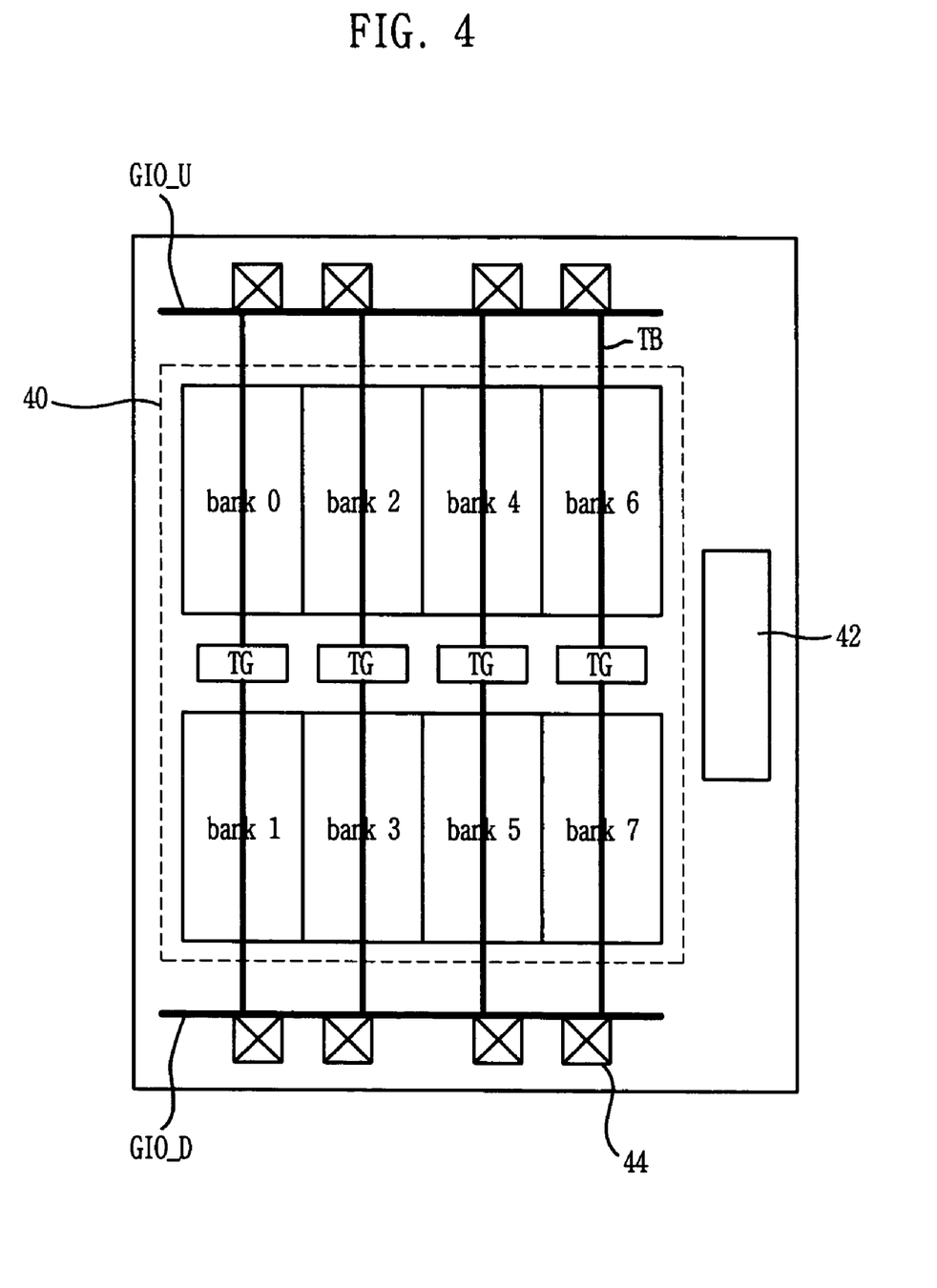
FIG. 4 provides a floor plan of a multi-port memory device having 8 banks in accordance with an embodiment of the present invention.

Referring to FIG. 4, there is provided a floor plan of a multi-port memory device having 8 banks in accordance with an embodiment of the present invention.

In FIG. 4, the multi-port memory device includes a plurality of banks, e.g., bank0, bank2, bank4 and bank6, and bank1, bank3, bank5 and bank7, arranged in a row direction at an upper and an lower portion of a core area 40, a multiplicity of ports 44 which are located at edges of the upper and the lower portions of the core area 40, each of the ports performing communication independently with other target devices (not shown), a first global data bus GIO_U, located in a row direction between the ports 44 arranged at the upper portion of the core area 40 and the banks, bank0, bank2, bnak4 and bank6, for performing the parallel data transmission, a second global data bus GIO_D, located in a row direction between the ports 44 arranged at the lower portion of the core area 40 and the banks, bank1, bank3, bnak5 and bank7, for performing the parallel data transmission, a majority of local data buses TB, located in a column direction of the banks, bank0 to the bank7, for executing the data transmission within the banks, and a number of local data bus connection units TG, located between two banks adjacent to each other in a column direction, e.g., bank0 and bank1, for selectively connecting the local data buses TB of the two adjacent banks.

Meanwhile, if it is required, the multi-port memory device further includes a control block 42. In FIG. 4, although there is exemplarily shown the control block 42 located at an edge of one side of the core area 40, the control block 42 can be employed at any place around the core area 40.

The multi-port memory device in accordance with the present invention has the ports 44 and the banks, bank0 to bank7, whose arrangement is similar to those of the multi-port memory device in FIG. 3. However, since the multi-port memory device in FIG. 4 includes the separated two global data buses GIO_U and GIO_D, it is possible to substantially reduce the loading of the global data buses compared to the conventional multi-port memory device in FIG. 3. Moreover, since the ports 44 are distributed at the outer side without leaning to one side as shown in FIG. 2, its packaging is easy and the expandability is superior.

In the inventive multi-port memory device, any one of the ports 44 can access to all memory cells. For instance, the access between the ports located at an edge of the upper portion of the core area 40 and the bank0 is performed through the first global data bus GIO_U and the local data bus TB of the bank0. The access between the ports located at the edge of the upper portion of the core area 40 and the bank1 is accomplished through the local data bus TB of the bank1, a corresponding local data bus connection unit TG, the bank0 adjacent to the bank1 in a column direction and the first global data bus GIO_U.

Figure 5:
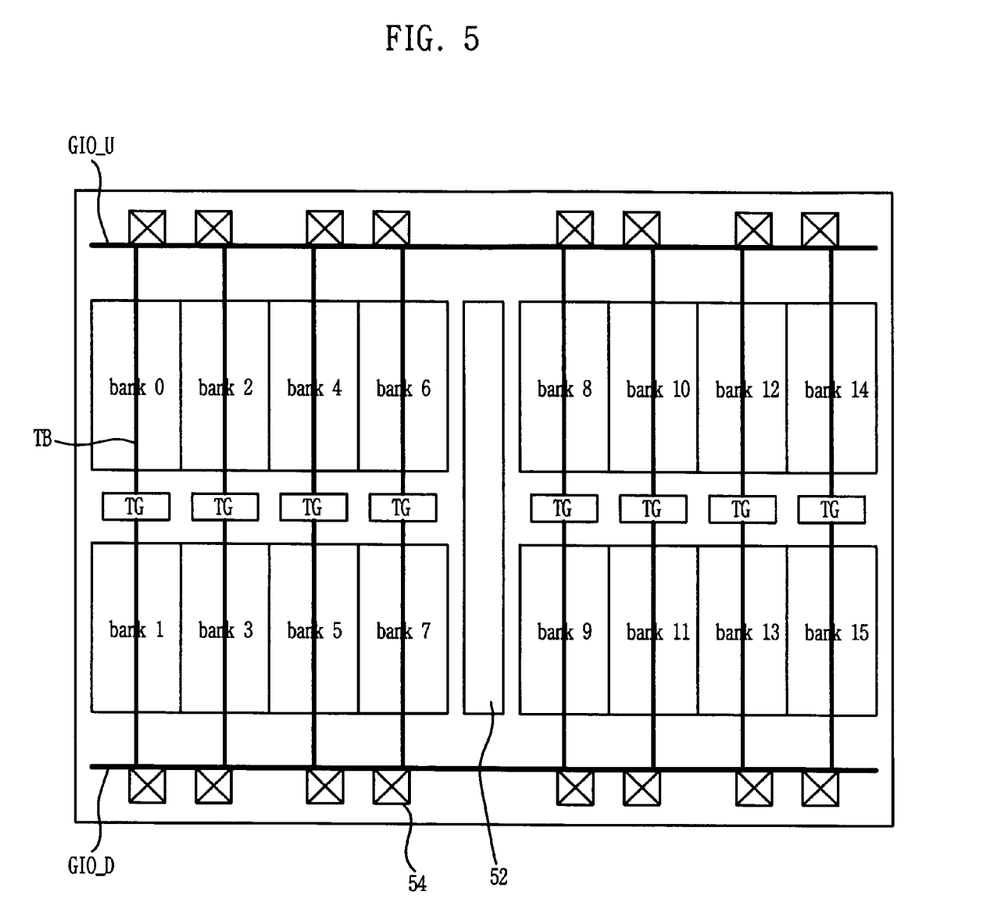
FIG. 5 shows a floor plan in case of extending the number of banks in the multi-port memory device in FIG. 4 to 16.

FIG. 5 shows a floor plan in case of extending the number of banks in the multi-port memory device in FIG. 4 to 16.

Referring to FIG. 5, the multi-port memory device is basically similar to that in FIG. 4. As the 8 banks are extended to 16 banks, the basic 8 banks, e.g., bank0 to bank7, and the other 8 banks, e.g., bank8 to bank15, are arranged at a left and a right side symmetrically by using a control block 52 as a central axis.

In this case, since global data buses GIO_U and GIO_D in FIG. 5 become longer twice than those in FIG. 4, there can occur a problem of signal line loading. Herein, a code '54' in FIG. 5 represents ports.

Figure 6:
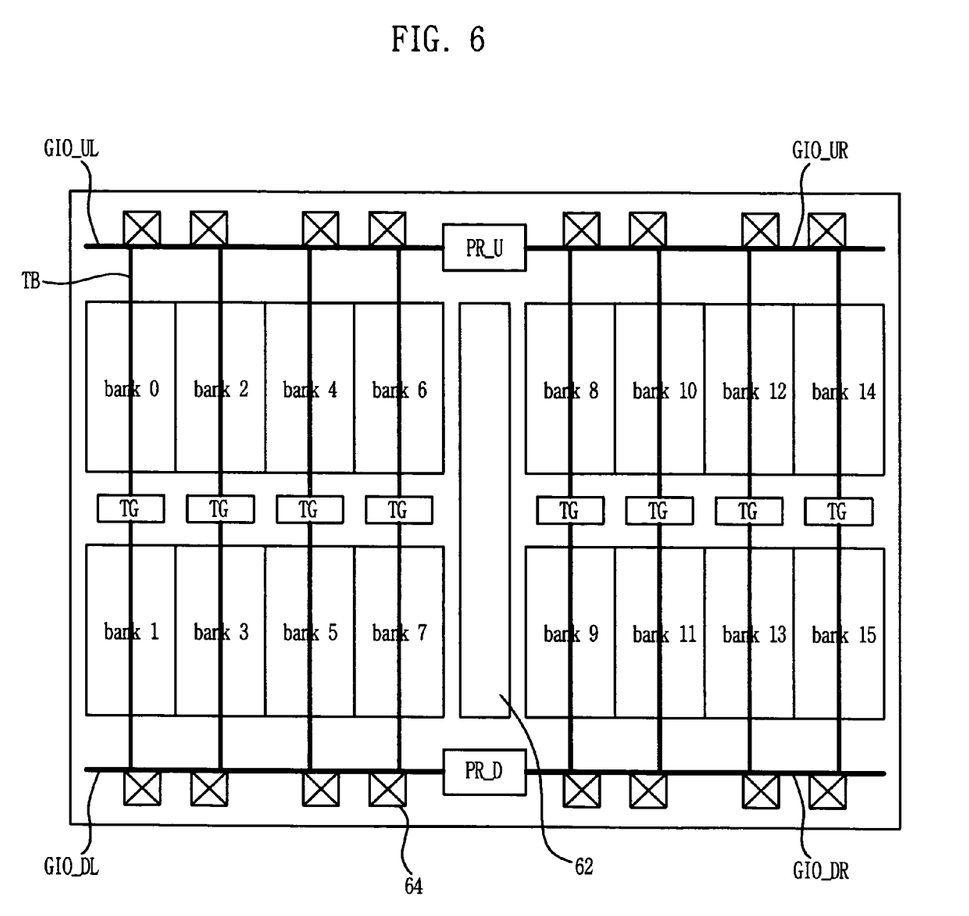
FIG. 6 depicts a floor plan of a multi-port memory device in accordance with another embodiment of the present invention.

FIG. 6 depicts a floor plan of a multi-port memory device in accordance with another embodiment of the present invention.

Compared to the multi-port memory device in FIG. 5, in the multi-port memory device in FIG. 6, an upper and a lower global data bus are extended by added banks, bank8 to bank15, arranged symmetrically with the basic banks, bank0 to bank7, by using a control block 62 as a central axis. The extended upper global data bus and lower global data bus are respectively divided into two global data buses. The multi-port memory device further includes a first and a second global data bus connection unit PR_U and PR_D so as to selectively connect the divided global data buses.

That is to say, the multi-port memory device has total 4 unit global data buses GIO_UL, GIO_UR, GIO_DL and GIO_DR. In case of separately including the control block 62, it is preferred that the control block 62 is located at a central area for improving the control efficiency.

Therefore, the multi-port memory device in FIG. 6 can reduce the loading of the global data buses substantially and obtain the packaging easiness and the expandability.

Figure 7:
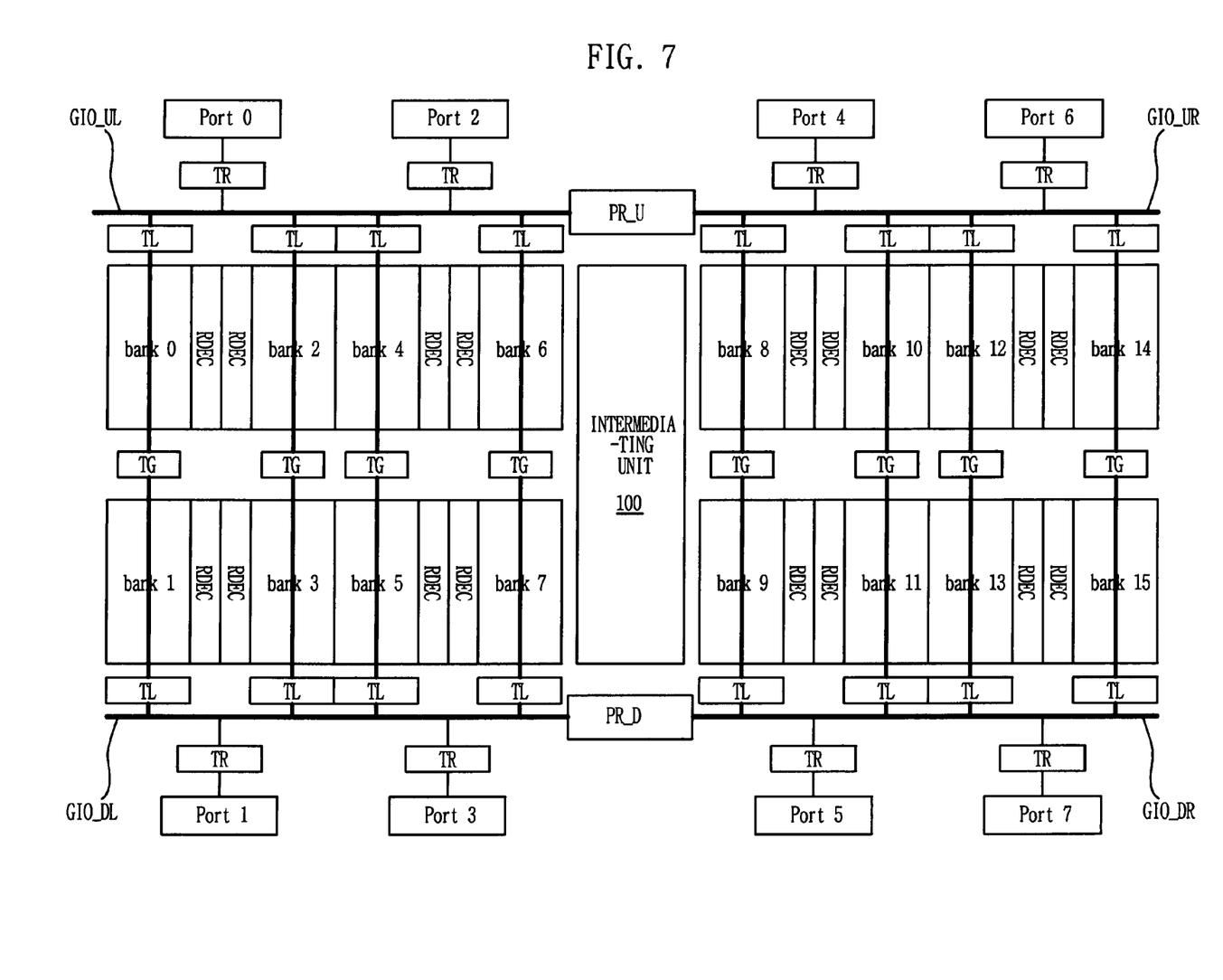
FIG. 7 represents architecture of a 256 Mmulti-port DRAM in accordance with the present invention.

FIG. 7 represents architecture of a 256 Mmulti-port DRAM in accordance with the present invention.

Referring to FIG. 7, the 256 Mmulti-port DRAM includes a number of memory cells, row decoders RDEC, a multiplicity of banks, bank0 to bank15, which are arranged as many as a certain number in a row direction (left and right directions in the drawing) in each of quadrants dividing the core area in four, an intermediating unit 100, arranged between a first and a third quadrant and a second and a fourth quadrant to divide the core area in two, for intermediating operations of components constructing the memory device by generating internal command signals, internal address signals and control signals based on commands and addresses provided from outside, a multiplicity of ports, port0 to port7, located at an edge of each quadrant, each port performing independent communication with a different target device, a first to a fourth global data bus GIO_UL, GIO_UR, GIO_DL and GIO_DR, arranged between banks and ports corresponding to each quadrant in a row direction, for performing parallel data transmission, a first and a second data bus connection unit PR_U and PR_D, located between two global data buses adjacent to each other in a row direction, for selectively connecting the two adjacent global data buses, a large number of transfer buses TB, arranged in a column direction (top and bottom in the drawing) of each bank, for performing data transmission within the banks, a majority of transfer bus connection units TG, located between two banks adjacent to each other in a column direction, for selectively connecting the transfer buses TB of the two adjacent banks, a multiplicity of bus connection units TL, each of which is located between a bank and a corresponding global data bus of a quadrant at which the bank is located and executes data exchange between its corresponding transfer bus TB and the corresponding global data bus, and several data transmission units TR, each of which is located between a port and a corresponding global data bus of a quadrant at which the port is located and performs data transmitting/receiving between the port and the corresponding global data bus.

Hereinafter, there will be described a detailed structure of the 256 Mmulti-port DRAM in accordance with the present invention.

Each of the 16 banks, bank0 to bank15, has 16M (8 k rows×2 k columns) DRAM cells and row decoders RDEC. In each bank, there are core circuits such as bit-line sense amplifiers, equalizers and so on essentially required in a core area of the DRAM.

The banks, bank0 to bank15, are arranged at the 4 quadrants obtained by dividing the core area in four, each quadrant including 4 banks in a row direction therein. In particular, the bank0, bank2, bank4 and bank6 are located at the first quadrant (upper left-hand) of the core area; the bank8, bank10, bank12 and bank14, the second quadrant (upper right-hand); the bank1, bank3, bank5 and bank7, the third quadrant (lower left-hand); and the bank9, bank11, bank13 and bank15, at the fourth quadrant (lower right-hand).

Meanwhile, it is preferred that the row decoder RDEC is located at one side of each bank and makes a pair with a row decoder of an adjacent bank. One page (column) is divided into 4 segments, each segment including 512 cells.

The intermediating unit 100 is a control block for intermediating operations of components constructing the memory device. For the purpose, by using addresses and commands transmitted thereto in a packet format, the intermediating unit 100 generates internal command signals such as an internal activation command signal ACT, an internal deactivation command signal PCG, an internal read command signal RD and an internal write command signal WD, internal address signals such as an activation array address AAA, a deactivation array address PAA, a read array address RAA, a write array address WAA, a row address RA, a read segment address RSA and a write segment address WSA, and control signals such as a transfer gate control signal TGC, a pipe register flag signal PRFG, a pipe register data driving signal DP and a DRAM core test mode flag signal DTM.

Among the ports, port0 to port7, every two ports are located at a die edge of each quadrant, i.e., a side of the major axis shared by all banks at each quadrant. In particular, the port0 and the port2 are arranged at the first quadrant; the port4 and the port6, the second quadrant; the port1 and the port3, the third quadrant; and the port5 and the port7, the fourth quadrant. Each port supports a serial I/O interface and independently communicates with a different target device, e.g., chipset, graphic chip, etc.

In case of the port0 to the port7 supporting the serial I/O interface, each of the port0 to port7 contains a plurality of pads corresponding to data, addresses, commands and so on, pad buffers, e.g., a read buffer and a write buffer, for buffering transmitting/receiving signals transferred to the pads, a decoder for decoding received data, an encoder for encoding data to be transmitted, and a data converter for converting received serial data to parallel data and parallel data to be transmitted to serial data.

Furthermore, the first global data bus GIO_UL is located between the banks and the ports of the first quadrant; the second global data bus GIO_UR, the second quadrant; the third global data bus GIO_DL, the third quadrant; and the fourth global data bus GIP_DR, the fourth quadrant. The firs to the fourth global data buses GIO_UL, GIO_UR, GIO_DL and GIO_DR are interactive data buses (512 bits) connected to the banks, the ports and the global data bus connection units PR_U and PR_D of respective corresponding quadrants.

The first global data bus GIO_UL and the second global data bus GIO_UR are connected through the first global data bus connection unit PR_U, and the third global data bus GIO_DL and the fourth global data bus GIO_DR are connected through the second global data bus connection unit PR_D. The first and the second global data bus connection units PR_U and PR_D employ interactive pipe registers whose number is corresponding to the number of signal lines of the global data bus, e.g., 512 registers.

The transfer bus TB is a local data bus for connecting a bit-line sense amplifier of each bank and a bus connection unit TL corresponding to the bank. The number of signal lines of the transfer bus TB is identical to that of cells of each segment, e.g., 512, and implemented with a differential bus.

The transfer bus connection unit TG can be implemented with MOS transistors whose number is identical to that of signal lines of the transfer bus TB. Since the transfer bus is the differential bus, one transfer bus connection unit TG can be made by total 512 number of MOS transistors.

The bus connection unit TL is constructed with total 16 sets, each set including 512 number of transfer latches. Each transfer latch has a read sense amplifier for sensing and latching read data on the transfer bus TB, a read driver for providing the latched data to the global data bus where its corresponding bank is located, a write latch for sensing and latching write data on the global data bus, and a write driver for supplying the write data to the transfer bus TB.

The data transmission unit TR has a transmitter Tx for providing the write data coupled to a corresponding port to the global data bus and a receiver Rx for transferring the read data coupled from the global data bus to the corresponding port.

Although there is not shown in the drawing, the inventive 256 Mmulti-port DRAM further includes voltage generators, located at each corner of a die, for producing an internal voltage based on an external voltage, test logics located between the ports corresponding to the first quadrant and the second quadrant and between the ports corresponding to the third quadrant and the fourth quadrant, and various pads containing a clock pad located at an edge of the die.

Each quadrant has command lines ACT, PCG, RD and WD reaching to a bank from the intermediating unit 100, and address lines AAA<0:1>, PAA<0:1>, RAA<0:1>, WAA<0:1>, RA<0:12>, RSA<0:1> and WSA<0:1> reaching to the bank from the intermediating unit 100. At the left and the right sides of the intermediating unit 100, there are transfer gate control lines TGC<0:3> reaching to the transfer gate TG from the intermediating unit 100.

Figure 8:
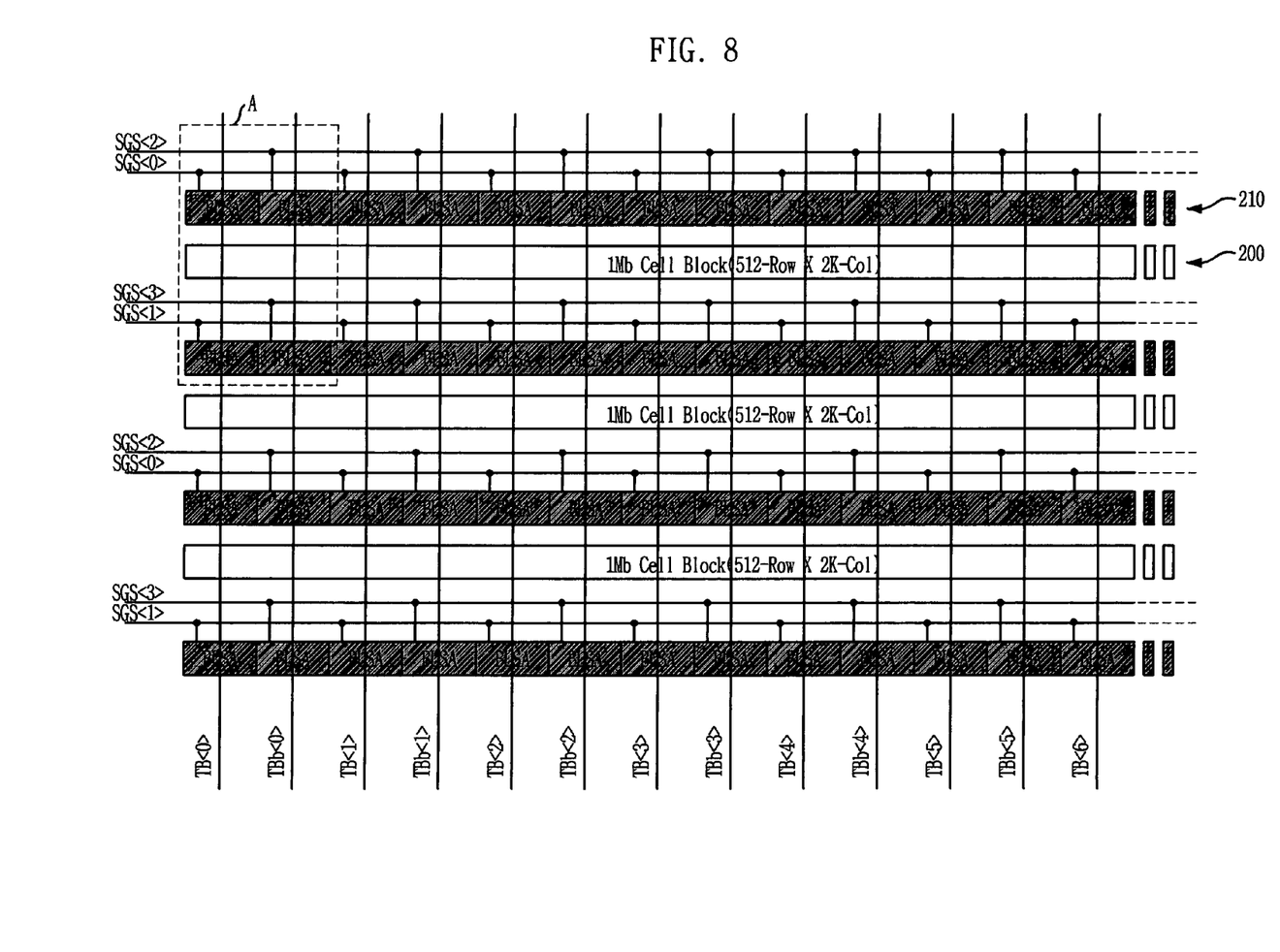
FIG. 8 is a view of explaining a relationship of a transfer bus TB and a segment that is a column component of the 256 Mmulti-port DRAM in accordance with the present invention.

FIG. 8 is a view of explaining a relationship of a transfer bus TB and a segment that is a column component of the 256 Mmulti-port DRAM in accordance with the present invention.

As shown in FIG. 8, the 256 Mmulti-port DRAM includes a plurality of memory cell arrays 200 and a multiplicity of bit-line sense amplifier arrays 210 like an existing DRAM. Referring to a box "A", at each memory cell array 200, one pair of transfer buses TB<0> and TBb<0> are connected to 4 bit-line sense amplifiers BLSA arranged at upper and lower parts of the memory cell array 200. The 4 bit-line sense amplifiers are controlled by respective different segment selection signals SGS<0:3>, which are signals corresponding to column selection signals Yi of the existing DRAM. Therefore, in case of 2 k columns, when one row and one segment are selected, 256 cells are selected at the same time, so that there occurs data exchange between transfer buses TB<0:255> of 256 bits and the selected 256 cells.

In the meantime, the transfer bus TB corresponding to each bank in the first quadrant can be connected to the transfer bus TB corresponding to each bank in the third quadrant located at the same column axis as the first quadrant through the transfer gate TG. Herein, 512 TGs make one set and there are total 8 sets. That is, the transfer gate TG is located between transfer buses TB corresponding to two banks (defined as an array) arranged at the same column axis so as to selectively connect the two transfer buses TB. The control signal TGC for controlling the transfer gate TG is generated at the intermediating unit 100.

Hereinafter, there will be explained an operation of the 256 Mmulti-port DRAM in accordance with the present invention shown in FIG. 8.

Figure 9A:
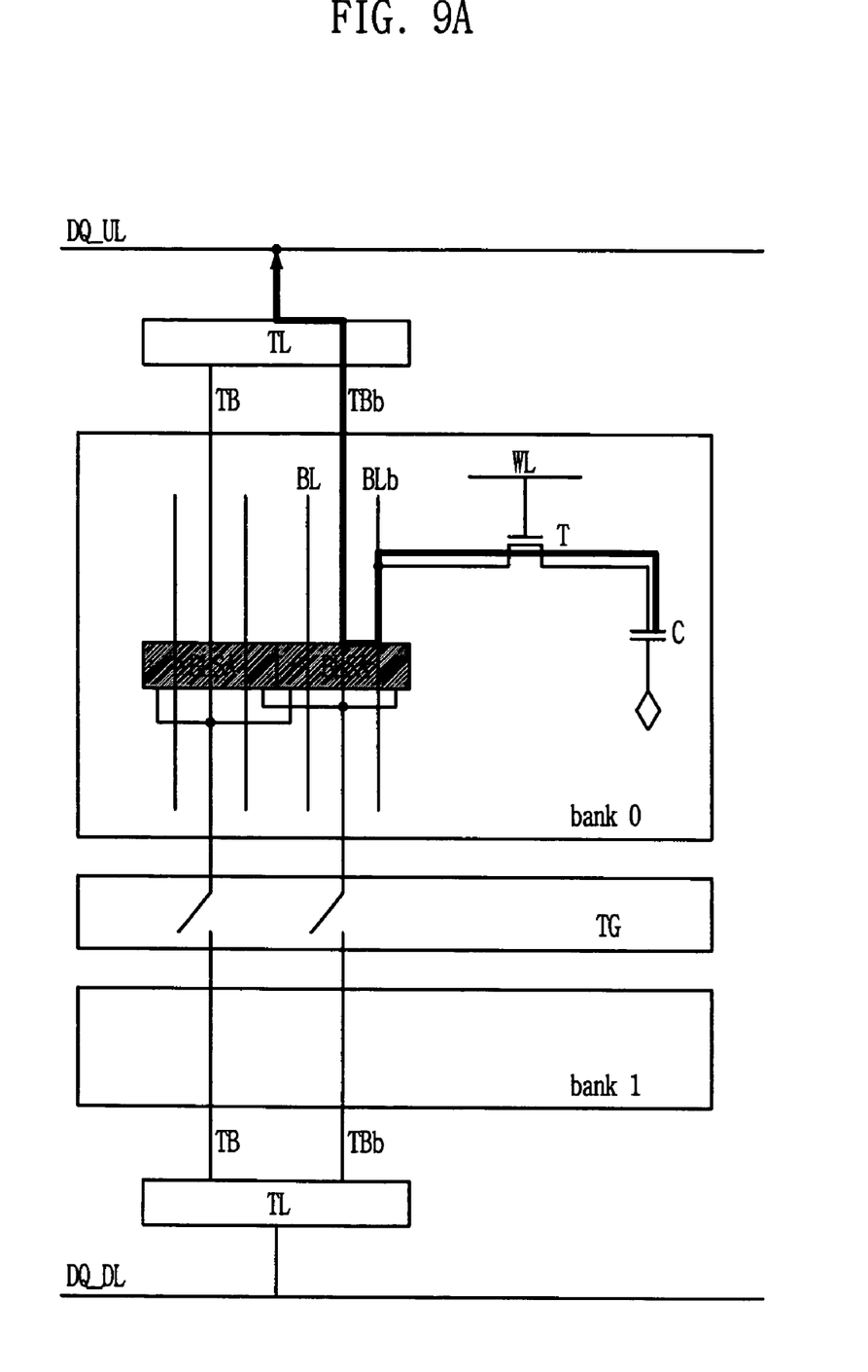
FIG. 9A presents a normal read path of the 256 Mmulti-port DRAM shown in FIG. 8.
Figure 9B:
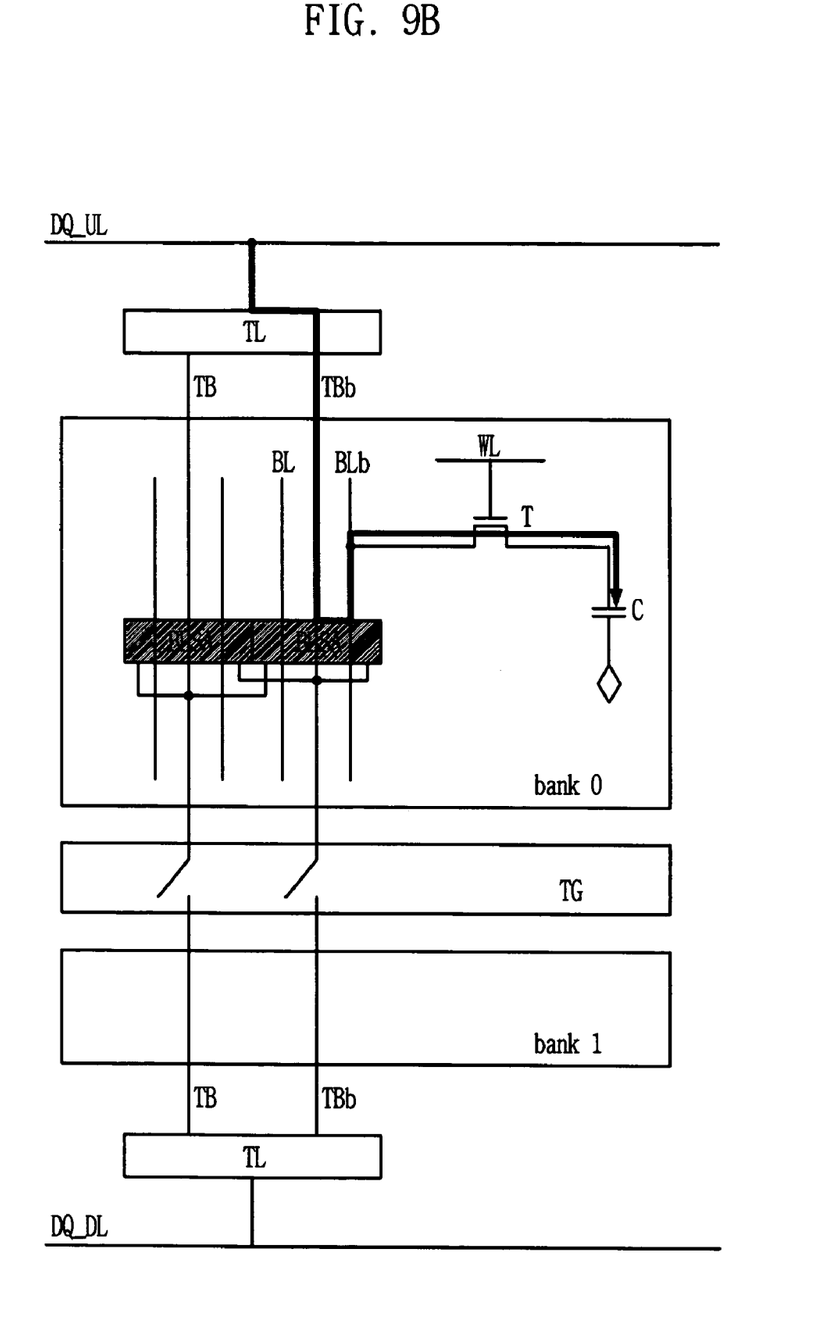
FIG. 9B shows a normal write path of the 256 Mmulti-port DRAM shown in FIG. 8.

FIGS. 9A and 9B present a normal read path and a normal write path of the 256 Mmulti-port DRAM shown in FIG. 8, respectively.

First of all, it is assumed that data (512 bits) of a certain segment in the bank0 are read out through the port0.

In FIG. 9A, if there are coupled commands, addresses, etc., related to a read operation through the port0 in a packet format, the intermediating unit 100 activates a certain row, i.e., a word-line WL, by generating the internal activation command signal ACT, the activation array address AAA and the row address RA for the bank0 and, then, produces the internal read command signal RD, the read array address RAA and the read segment address RSA for the bank0. After then, the bit-line sense amplifier BLSA senses and amplifies 512 bit data for the segment corresponding to the read segment address RSA to thereby transfer the sensed and amplified data to the transfer buses TB and TBb. The bus connection unit TL of the bank0 senses the read data on the transfer buses TB and TBb and transmits the sensed data to the first global data bus GIO_UL. The read data transferred onto the first global data bus GIO_UL is stored at the read buffer in the port0 via the receiver Rx of the data transmission unit TR corresponding to the port0. The data stored at the read buffer are converted to a certain unit packet and transferred to a target device connected to the port0 in a serial data format. Then, the intermediating unit 100 deactivates the row of the corresponding array by generating the internal deactivation command signal PCG and the deactivation array address PAA. At this time, the transfer bus connection unit TG of the corresponding array is switched-off to thereby disconnect the transfer buses TB and TBb of the bank0 and those of the bank1 in the same array. In FIG. 9A, 'BL and BLb' represent a pair of bits; 'T' means a cell transistor; and 'C' presents a cell capacitor.

Next, it is assumed that the data (512 bits) are written into the certain segment in the bank0 through the port0.

Referring to FIG. 9B, if there are coupled commands, addresses, data, etc., related to a write operation through the port0 in a packet format, the intermediating unit 100 activates a certain row, i.e., a word-line WL, by generating the internal activation command signal ACT, the activation array address AAA and the row address RA for the bank0 and, then, produces the internal write command signal WD, the write array address WAA and the write segment address WSA for the bank0. At this time, the 512 bit data stored at the write buffer of the port0 are written into the certain segment, i.e., 512 memory cells, corresponding to the write segment address WSA by the scheduling of the intermediating unit 100. The data converted to parallel data at the port0 are loaded onto the first global data bus GIO_UL via the transmitter Tx of the data transmission unit TR. The data loaded onto the first global data bus GIO_UL are transmitted onto the transfer buses TB and TBb of the bank0 through the bus connection unit TL of the bank0. The data provided onto the transfer buses TB and TBb of the bank0 are stored at the 256 memory cells via the bit-line sense amplifier BLSA corresponding to the write segment address WSA. Then, the intermediating unit 100 produces the internal deactivation command signal PCG and the deactivation array address PAA to thereby deactivate the row of the corresponding array.

Figure 10A:
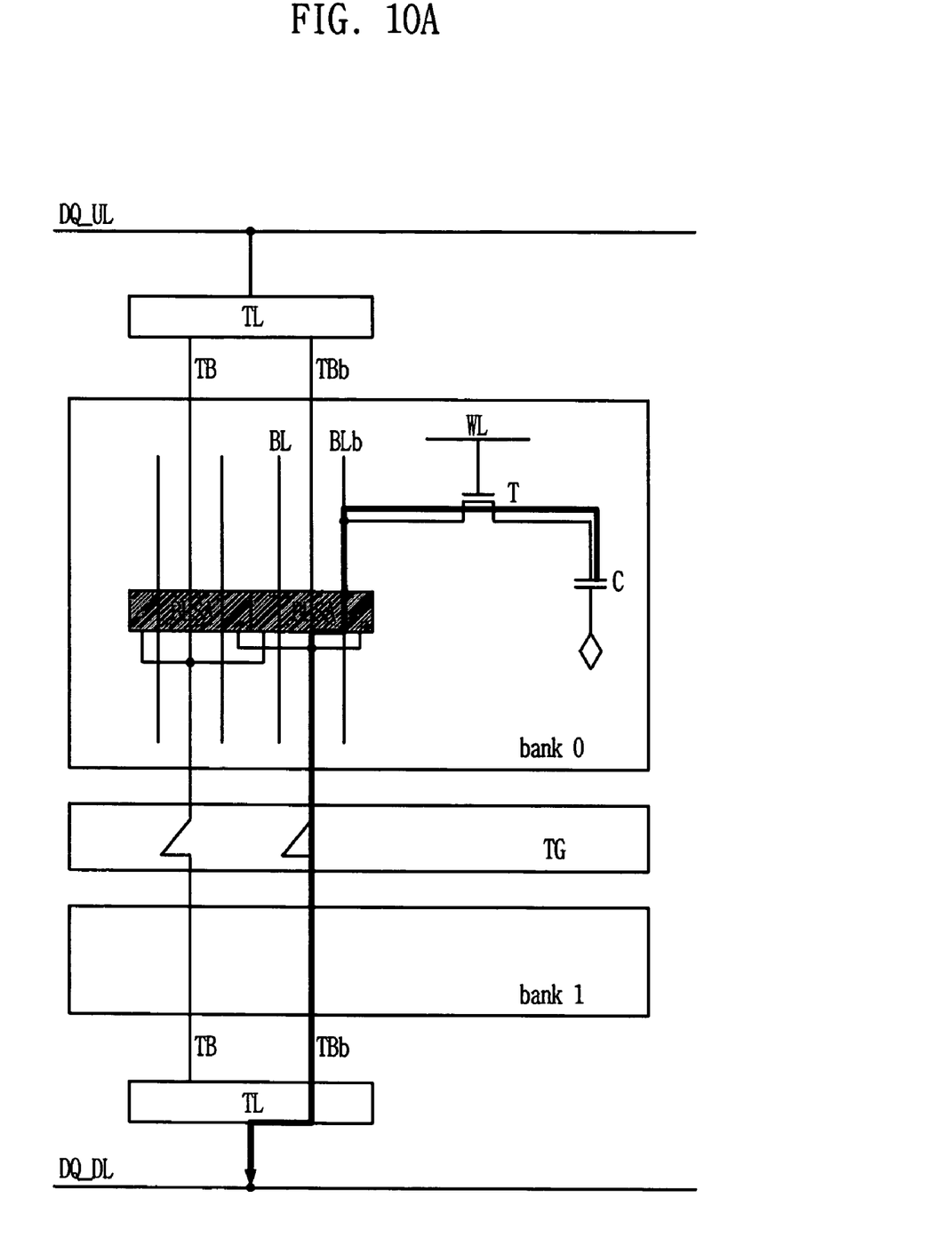
FIG. 10A depicts a cross read path of the 256 Mmulti-port DRAM shown in FIG. 8.
Figure 10B:
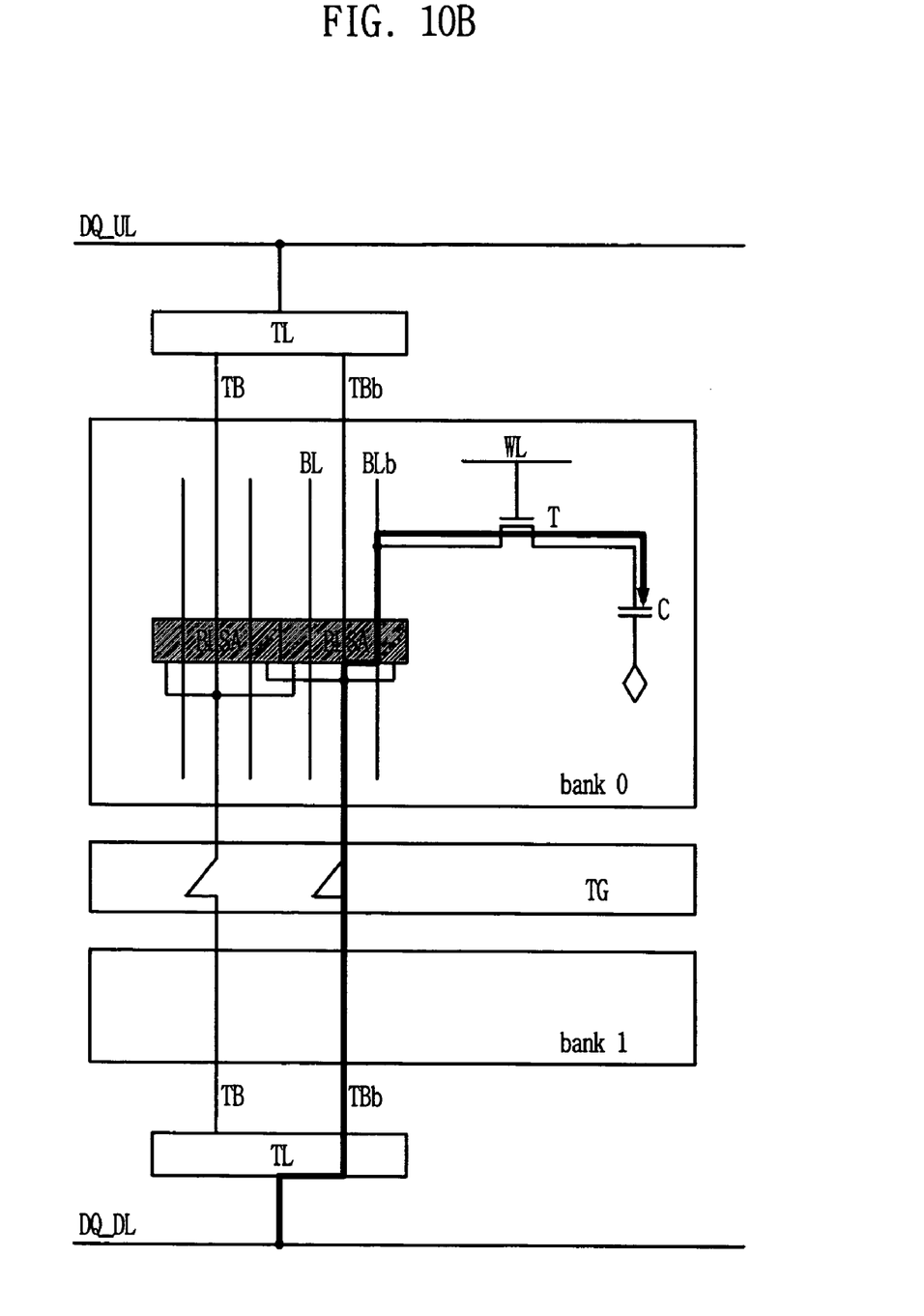
FIG. 10B represents a cross write path of the 256M multi-port DRAM shown in FIG. 8.

FIGS. 10A and 10B depict a cross read path and a cross write path of the 256 Mmulti-port DRAM shown in FIG. 8, respectively.

Referring to FIG. 10A, although its overall operation is very similar to the normal read operation described above, it is different that the transfer buses TB and TBb of the bank0 are connected to those of the bank1 in the same array by the transfer bus connection unit TG of the array being switched-on. Meanwhile, the data loaded on the transfer buses TB and TBb of the bank1 are transmitted to a target device through the bus connection unit TL corresponding to the bank1, the third global data bus GIO_DL, the data transmission unit TR corresponding to the port1, and the port1.

It is assumed that the data (512 bits) are written into a certain segment in the bank0 through the port1.

Referring to FIG. 10B, although its overall operation is very similar to the normal write operation described above, it is different that the transfer buses TB and TBb of the bank0 are connected to those of the bank1 in the same array by the transfer bus connection unit TG of the array being switched-on. In this case, the data coupled to the port1 are loaded onto the transfer buses TB and TBb of the bank0 through the data transmission unit TR corresponding to the port1, the third global data bus GIO_DL and the bus connection unit TL corresponding to the bank1, and the following processes are same in the normal writing case.

In the meantime, when the data exchange is required between the first global data bus GIO_UL and the second global data bus GIO_UR, the two global data buses GIO_UL and GIO_UR are connected through the first global data bus connection unit PR_U. Furthermore, when the data exchange is required between the third global data bus GIO_DL and the fourth global data bus GIO_DR, the two global data buses GIO_DL and GIO_DR are connected through the second global data bus connection unit PR_D.

As described above, the inventive multi-port DRAM can access to all segments at all of the ports, port0 to port7. That is, since the independent access is possible through the plurality of ports except that the use of the global data buses is executed at the same time, the multi-access is performed at the same time.

In a conventional SDRAM operating in a clock frequency of 100 MHz, a bandwidth is 32×100 MHz (3.2 Gb/s (400 MB/s)) although it is assumed a X32 bandwidth option. In case of designing a memory device having data buses of more than 64 bits in order to enlarge a bandwidth as using the current DRAM data I/O architecture, the skew between data lines are substantially increased at the data buses and there occurs the increase of current consumption due to lots of I/O data transmission. Moreover, it is almost impossible to implement the memory device having the data buses of more than 64 bits since there are the difficulty of packaging and the increase of layout area due to the arrangement of many I/O pads. Although it is possible to implement the memory device, there occurs large loss at other parts than a gain obtained from the bandwidth increase.

On the other hand, in case of the inventive multi-port DRAM, it is possible to manage 512 bits at each quadrant of the core area in parallel by employing the new architecture and the serial data input/output can be performed at each port. As a result, the increase of the layout area is minimized and the packaging is easily implemented. Further, without inducing the skew between data lines of the data buses, it is possible to substantially enlarge the bandwidth.

In the above embodiments, the DRAM cells are exemplarily used, the present invention is applicable to cells of other RAMs, e.g., SRAM.

Moreover, although the embodiments used a unit segment of 512 bits, the present invention is applicable to a case of the bit number of the unit segment being changed.

The numbers of ports and banks used in the above embodiments can be changed according to the capability of the memory device.

Through the use of the present invention, there is provided a new memory device employing a plurality of ports each of which performs independent data exchange. As a result, there are secured the layout efficiency, the packaging easiness and the expandability of the multi-port memory device as well as the line loading of the global data bus being decreased. Furthermore, the inventive memory device contributes to the development of memory technology by accepting the requirements of broad bandwidth, serial I/O interface, multi-port access and so on.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device, comprising:
   a plurality of banks arranged at an upper and a lower portion of a core area as many as a fixed number in a row direction;
   a multiplicity of ports located at edges of the upper and the lower portions of the core area, wherein respective ports perform independent communication with respective different target devices;
   a first global data bus, located in a row direction between the ports and the banks arranged at the upper portion of the core area, for performing the parallel data transmission;
   a second global data bus, located in a row direction between the ports and the banks arranged at the lower portion of the core area, for performing the parallel data transmission;
   a plurality of local data buses, arranged in a column direction of each bank, for executing data transmission within the banks; and
   a majority of local data bus connection units, located between two banks adjacent to each other in a column direction, for selectively connecting the local data buses corresponding to the two adjacent banks.

2. The multi-port memory device as recited in claim 1, further comprising a control block arranged at one side of the core area.

3. A multi-port memory device, comprising:
   a plurality of banks arranged at each of 4 quadrants obtained by dividing a core area in four as many as a fixed number in a row direction, wherein each bank includes a multiplicity of memory cells and a row decoder;
   a majority of ports located at edges of said each of the 4 quadrants, wherein respective ports perform independent communication with respective different target devices;
   a first to a fourth global data bus, located in a row direction between the ports and the banks corresponding to said each of the 4 quadrants, for performing the parallel data transmission;
   a first and a second global data bus connection means, located between two global data buses adjacent to each other in a row direction, for selectively connecting the two global data buses;
   a multiplicity of local data buses, arranged in a column direction of each bank, for executing data transmission within the banks; and
   local data bus connection means, located between two banks adjacent to each other in a column direction, for selectively connecting local data buses corresponding to the two adjacent banks.

4. The multi-port memory device as recited in claim 3, further comprising a control block arranged between the first and the third quadrants and the second and the fourth quadrants to divide the core area in two.

5. A multi-port memory device, comprising:
   a plurality of banks arranged at each of 4 quadrants obtained by dividing a core area in four as many as a fixed number in a row direction, wherein each bank includes a multiplicity of memory cells and a row decoder;
   an intermediating means, located between the first and the third quadrants and the second and the fourth quadrants to divide the core area in two, for intermediating operations of components constructing the memory device by generating internal command signals, internal address signals and control signals based on commands and addresses provided from outside;
   a majority of ports located at edges of said each of the 4 quadrants, wherein respective ports perform independent communication with respective different target devices;
   a first to a fourth global data bus, located in a row direction between the ports and the banks corresponding to said each of the 4 quadrants, for performing the parallel data transmission;
   a first and a second global data bus connection means, located between two global data buses adjacent to each other in a row direction, for selectively connecting said two global data buses;
   a multiplicity of local data buses, arranged in a column direction of each bank, for executing data transmission within the banks;
   a plurality of local data bus connection means, located between two banks adjacent to each other in a column direction, for selectively connecting the local data buses corresponding to the two adjacent banks;
   a plurality of bus connection means, located between each bank and a global data bus corresponding to a quadrant where said each bank is included, for performing data communication between each local data bus and said global data bus; and
   a number of data transmission means, located between each port and a global data bus corresponding to said each port, for performing data transmitting/receiving between said each port and said global data bus.

6. The multi-port memory device as recited in claim 5, wherein each bank includes:
   a plurality of memory cell arrays;
   a multiplicity of bit-line sense amplifier arrays; and
   a row decoder, wherein a unit page of each memory cell array is divided into 4 segments.

7. The multi-port memory device as recited in claim 6, wherein each of the local data buses connects bit-line sense amplifiers of each bank and the bus connection means corresponding to said each bank and includes differential bus lines as many as the number of cells within a unit segment.

8. The multi-port memory device as recited in claim 7, wherein each of the local data bus connection means includes MOS transistors as many as the number of lines of a local data bus.

9. The multi-port memory device as recited in claim 7, wherein each of the bus connection means includes transfer latches as many as the number of cells within the unit segment, each of the transfer latch containing:
   a read sense amplifier for sensing and latching read data on the local data bus;

a read driver for providing the latched data to a global data bus of a quadrant where a corresponding bank is located;

a write latch for sensing and latching write data on the global data bus of the quadrant where the corresponding bank is located; and a write driver for coupling write data to a local data bus of the corresponding bank.

10. The multi-port memory device as recited in claim 5, wherein each of the ports includes:

a plurality of pads corresponding to data, addresses and commands;

a pad buffer for buffering transmitting/receiving signals provided to the pads;

a decoder for decoding received data;

an encoder for encoding data to be transmitted; and a data converter for converting received serial data to parallel data and parallel data to be transmitted to serial data.

11. The multi-port memory device as recited in claim 10, wherein each of the data transmission means includes:

a transmitter for providing write data coupled to a port connected to the data transmission means to a corresponding global data bus; and a receiver for supplying read data provided from the corresponding global data bus to said port.

12. The multi-port memory device as recited in claim 5, wherein each of the first and the second global data bus connection means includes interactive pipe registers as many as the number of lines of each of the first to the fourth global data buses.

13. The multi-port memory device as recited in claim 5, further comprising:

voltage generators for producing an internal voltage based on an external voltage provided from outside; and test logics located between ports corresponding to the first quadrant and the second quadrant and between ports corresponding to the third quadrant and the fourth quadrant.

* * * * *